United States Patent
Lin et al.

(10) Patent No.: US 6,376,359 B1
(45) Date of Patent: *Apr. 23, 2002

(54) METHOD OF MANUFACTURING METALLIC INTERCONNECT

(75) Inventors: Yei-Hsiung Lin, Hsinchu; Chen-Bin Lin, Taipei; Chin-Chun Huang, Taichung, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/080,082

(22) Filed: May 15, 1998

(30) Foreign Application Priority Data

Mar. 18, 1998 (TW) ........................................ 87104003 A

(51) Int. Cl.$^7$ ...................... H01L 21/4763; H01L 23/48
(52) U.S. Cl. ...................... 438/622; 438/623; 438/624; 438/672; 257/759; 257/760
(58) Field of Search .................. 257/758, 751, 257/759–760; 438/645, 700, 692, 672, 625, 624, 586, 386, 3, 622–626

(56) References Cited

U.S. PATENT DOCUMENTS

| | | | | |
|---|---|---|---|---|
| 4,986,878 A | * | 1/1991 | Malazgirt et al. | 438/699 |
| 5,003,062 A | * | 3/1991 | Yen | 438/761 |
| 5,110,763 A | * | 5/1992 | Matsumoto | 438/624 |

(List continued on next page.)

FOREIGN PATENT DOCUMENTS

JP 06077478 A * 3/1994

OTHER PUBLICATIONS

Aceves et al., "Study on the Al/Silicon Rich Oxide/Si Structure as a Surge Suppresser", IEEE, Poster Presentations, 1997, pp. 132–133.*

Lin et al., "Enhanced Tunneling Characteristics of PECVD Silicon–Rich–Oxide (SRO) for the Application in Low Voltage Flash EEPROM", IEEE Transactions on Electron Devices, vol. 43, No. 11, 1996, pp. 2021–2023.*

Dündar et al., "Comparing Models for the Growth of Silicon–Rich Oxides (SRO)", IEEE Transactions on Semiconductor Manufacturing, vol. 9, No. 1, 1996, pp. 74–81.*

Dori et al., "Optimized Silicon–Rich Oxide (SRO) Deposition Process for 5–V–Only Flash EEPROM Applications", IEEE Electron Device Letters, vol. 14, No. 6, 1993, pp. 283–285.*

Chang et al., "Dominance of Interface Effects in SRO–SiO2–SRO DEIS Structures for EAROM's", IEEE Transactions on Electron Devices, vol. 35, No. 10, 1988, pp. 1645–1650.*

*Primary Examiner*—Eddie Lee
*Assistant Examiner*—José R. Diaz

(57) ABSTRACT

A method of manufacturing metallic interconnects capable of reducing internal stress inside the metallic layer. The method comprises the steps of forming a silicon-rich oxide layer both before and after the formation of a metallic layer. Therefore, the metallic layer is fully enclosed by silicon-rich oxide layers and any direct contact between the metallic layer and any silicon dioxide layer is avoided. Since the quantity of silicon in the silicon-rich oxide layer is much higher than in a silicon dioxide layer, bonds formed between a silicon atom and an oxygen atom in the silicon-rich oxide layer are much stronger. Consequently, the chance for an aluminum atom in the metallic layer to react with an oxygen atom in the silicon-rich oxide layer is greatly reduced. Hence, lattice vacancies/voids that can lead to conventional stress migration and thermal induced migration problems are prevented.

13 Claims, 3 Drawing Sheets

U.S. PATENT DOCUMENTS

| | | | | |
|---|---|---|---|---|
| 5,250,468 A | * | 10/1993 | Matsuura et al. | 438/790 |
| 5,374,833 A | * | 12/1994 | Nariani et al. | 257/52 |
| 5,382,545 A | * | 1/1995 | Hong | 438/624 |
| 5,399,533 A | * | 3/1995 | Pramanik et al. | 438/624 |
| 5,435,888 A | * | 7/1995 | Kalnitsky et al. | 438/624 |
| 5,496,774 A | * | 3/1996 | Pramanik et al. | 438/624 |
| 5,534,731 A | * | 7/1996 | Cheung | 257/759 |
| 5,596,230 A | * | 1/1997 | Hong | 257/758 |
| 5,604,158 A | * | 2/1997 | Cadien et al. | 438/645 |
| 5,830,804 A | * | 11/1998 | Cleeves et al. | 438/672 |
| 5,889,330 A | * | 3/1999 | Nishimura et al. | 257/758 |
| 5,923,074 A | * | 7/1999 | Jeng | 257/522 |
| 5,963,837 A | * | 10/1999 | Ilg et al. | 438/760 |
| 5,976,984 A | * | 11/1999 | Chen et al. | 438/700 |
| 5,981,395 A | * | 11/1999 | Huang et al. | 438/692 |

* cited by examiner

METHOD OF MANUFACTURING METALLIC INTERCONNECT

CROSS-REFERENCE TO RELATED APPLICATION

This application claims the priority benefit of Taiwan application serial no. 87104003, filed Mar. 18, 1998, the full disclosure of which is incorporated herein by reference.

BACKGROUND OF THE INVENTION

1. Field of Invention

The present invention relates to a method of manufacturing a metallic interconnect. More particularly, the present invention relates to a method of manufacturing a metallic interconnect that can produce a metallic layer having low internal stress.

2. Description of Related Art

As the level of integration for semiconductor devices continues to increase, more MOS transistors can be packed within a given wafer surface. As the number of transistors increases, the number of metallic interconnects required to connect them also rises correspondingly. Soon, wafer surface area will be insufficient for laying down all the necessary interconnects. Consequently, designs having two or more metallic layers have become a necessity for integrated circuit fabrication. Since these metallic layers must be separated from each other by an inter-metal dielectric layer to prevent short-circuiting, the properties and quality of the inter-metal dielectric layer are an important consideration.

At present, aluminum is the most commonly used conductive material in the fabrication of VLSI circuits. Aluminum has good electrical conductivity, is relatively cheap, is easy to deposit and etch, and has good adhesion with a silicon surface. Hence, aluminum is widely used as runners for connecting devices. However, as the level of integration of semiconductor devices continues to increase, many technical difficulties regarding the use of aluminum as a runner for devices are being encountered.

Conventionally, silicon dioxide ($SiO_2$) is used as an inter-metal dielectric layer. However, aluminum is able to carry out the following chemical reaction with silicon dioxide at an aluminum/silicon dioxide interface:

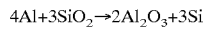

According to thermodynamics, aluminum oxide ($Al_2O_3$) is more stable than silicon dioxide ($SiO_2$). Therefore, silicon dioxide and aluminum can easily inter-diffuse at an elevated temperature, replacing the silicon dioxide by aluminum oxide. In other words, spiking can easily occur at the aluminum/silicon dioxide interface.

Whenever aluminum and silicon dioxide interact chemically at the aluminum/silicon dioxide interface, there will be corresponding change in volume. From the above chemical formula, it can be easily shown that the volume occupied by aluminum ($1.66 \times 10^{-23}$ $cm^3$/atom) and silicon dioxide ($4.3 \times 10^{-23}$ $cm^3$/molecule) together is much larger than the volume of aluminum oxide ($4.27 \times 10^{-23}$ $cm^3$/molecule) and silicon ($2 \times 10^{-23}$ $cm^3$/atom) after the reaction. Therefore, due to the change in volume before and after the chemical reaction, lattice vacancies will be formed at the interface. The accumulation of these lattice vacancies will result in the formation of voids along, the aluminum lines, and may give rise to stress migration or thermal induced migration problems.

The continuous use of integrated circuits speeds up the growth of the above voids in the aluminum runners. Finally, at some point, some of the voids may grow large enough to join together, thereby opening the circuit. Therefore, functional failure or reliability problems may result.

FIGS. 1A and 1B are cross-sectional views showing the progression of manufacturing steps in fabricating a conventional metallic interconnect. First, as shown in FIG. 1A, a metallic layer 12 made from aluminum or aluminum alloy is formed over a substrate 10. A MOS device below the metallic layer 12 is not shown in FIG. 1A. Next, a conformal oxide layer 14 is formed over the metallic layer 12 and the substrate 10, and then a glass layer 16 having a good gap-filling capacity is spin-coated over the oxide layer 14. The spin-coated glass layer 16 can be formed from silicate, siloxane or hydrogen silsesquoxane (HSQ) material. Thereafter, another oxide layer 18, for example, a silicon dioxide layer having a pre-defined thickness, is deposited over the glass layer 16 and the oxide layer 14. Next, as shown in FIG. 1B, the oxide layer 18 is planarized using, for example, a chemical-mechanical polishing method, thus obtaining a planar oxide layer 18a. Then, a metal plug 15 is formed, to act as an electrical connection between the metallic layer 12 and another subsequently formed metallic layer. After the above operations, the original oxide layers 18 and 14 now become oxide layers 18a and 14a. The oxide layer 18a, the spin-coated glass layer 16 and the oxide layer 14a together constitute an inter-metal dielectric layer. Finally, a metallic layer 13 made from aluminum or aluminum alloy is formed over the oxide layer 18a.

In the manufacturing of metallic interconnects, lattice vacancies can easily form at the interface between the metallic layer 12 and the oxide layer 14a as well as the interface between the metallic layer 13 and the oxide layer 18a. Eventually, voids are formed in the metallic layers 12 and 13, resulting in stress migration and thermal induced migration problems. Therefore, metallic runners can easily break causing an open circuit condition, which compromise the reliability of the devices.

In light of the foregoing, there is a need to improve the method of manufacturing metallic interconnects.

SUMMARY OF THE INVENTION

Accordingly, the present invention is to provide a method of manufacturing metallic interconnects capable of producing a metallic layer having lower internal stress and higher device reliability.

To achieve these and other advantages and in accordance with the purpose of the invention, as embodied and broadly described herein, the invention provides a method of manufacturing metallic interconnects. The method comprises the steps of forming a silicon-rich oxide layer both before and after the formation of a metallic layer. Therefore, the metallic layer is fully enclosed by silicon-rich oxide layer and any direct contact between the metallic layer and any silicon dioxide layer is avoided. Hence, lattice vacancies/voids that can lead to conventional stress migration and thermal induced migration problems are prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
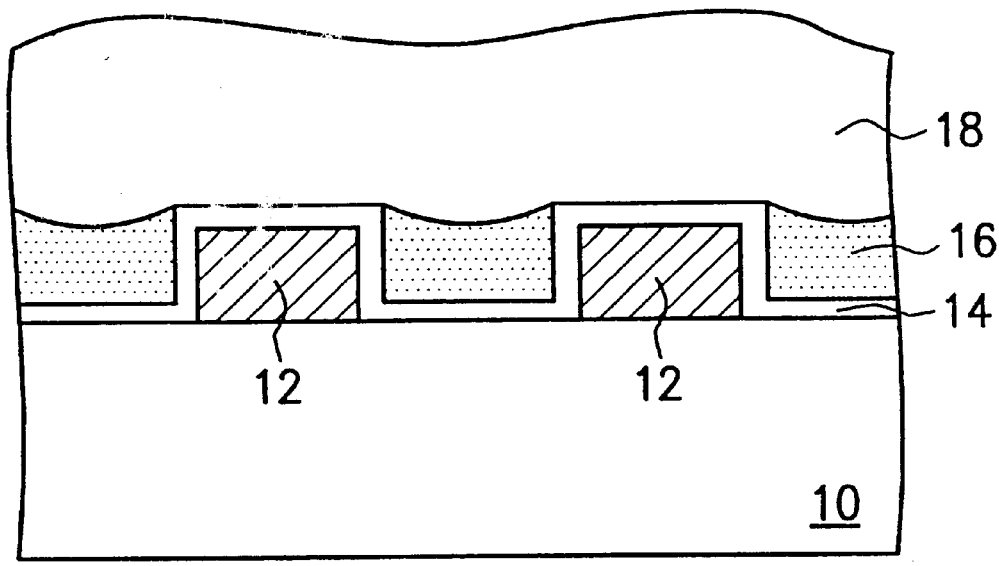
FIGS. 1A and 1B are cross-section views showing the progression of manufacturing steps in fabricating a conventional metallic interconnect.
Figure 1B:
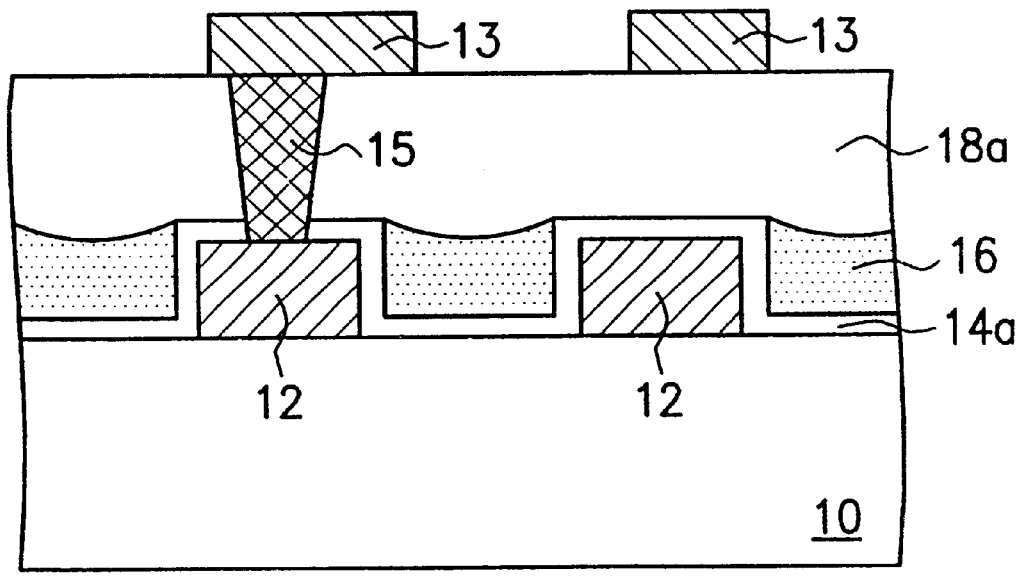

Detailed reference will now be made to the present preferred embodiments of the invention, examples of which are illustrated in the accompanying drawings. Wherever possible, the same reference numbers are used in the drawings and the description to refer to the same or like parts.

FIGS. 2A through 2D are cross-sectional views showing the progression of manufacturing steps in fabricating a metallic interconnect that has a lower internal stress according to one preferred embodiment of this invention.

Figure 2A:
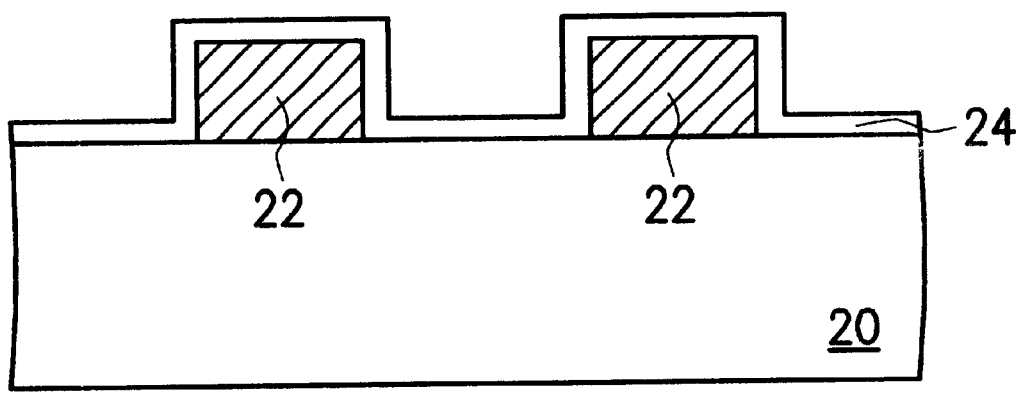
FIGS. 2A through 2D are cross-sectional views showing the progression of manufacturing steps in fabricating a metallic interconnect that has a lower internal stress according to one preferred embodiment of this invention.

First, as shown in FIG. 2A, a metallic layer 22 made from, for example, an aluminum layer or aluminum alloy is formed over a substrate 20. A MOS device below the metallic layer 22 is not shown in FIG. 2A. Next, a conformal silicon-rich oxide layer 24 is formed over the metallic layer 22. Since the quantity of silicon in the silicon-rich oxide layer is much higher than in a silicon dioxide layer, bonds formed between a silicon atom and an oxygen atom in the silicon-rich oxide layer are much stronger. Consequently, the chance for an aluminum atom in the metallic layer 22 to react with an oxygen atom in the silicon-rich oxide layer 24 is greatly reduced, and the formation of lattice vacancies and voids is prevented. Without internal vacancies and voids, internal stresses are greatly lowered.

Figure 2B:
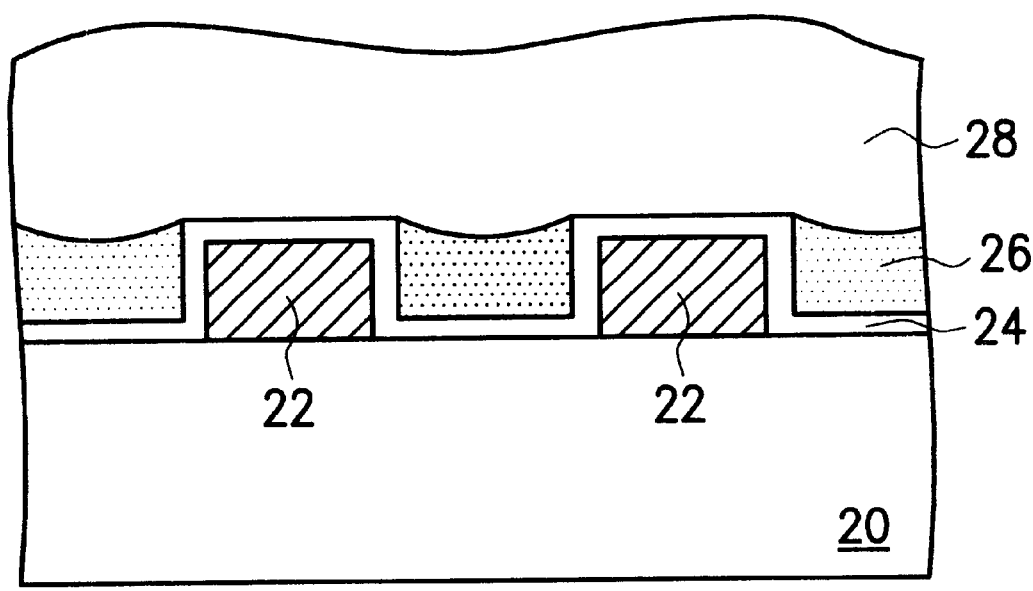

Next, as shown in FIG. 2B, a glass layer 26 having a good gap-filling capacity is spin-coated over the silicon-rich oxide layer 24. The spin-coated glass layer 26 can be formed from silicate, siloxane or hydrogen silsesquoxane (HSQ) material. Thereafter, an oxide layer 28, for example, a silicon dioxide layer having a pre-defined thickness, is deposited over the glass layer 26 and the silicon-rich oxide layer 24.

Figure 2C:
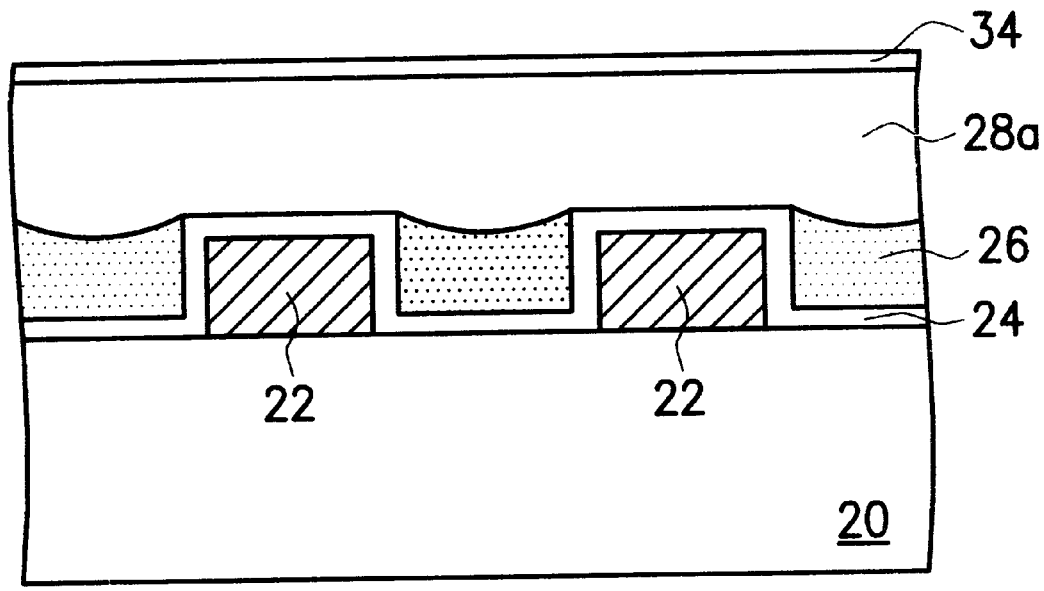

Next, as shown in FIG. 2C, the oxide layer 28 is planarized using, for example, a chemical-mechanical polishing method, thus obtaining a planar oxide layer 28a. Then, another silicon-rich oxide layer 34 is formed over the oxide layer 28a so that the silicon dioxide layer within the inter-metal dielectric layer is prevented from coming into direct contact with a subsequently formed metallic layer. The silicon-rich oxide layer 34, the oxide layer 28a, the spin-coated glass layer 26 and the silicon-rich oxide layer 24 together constitute an inter-metal dielectric layer.

Figure 2D:
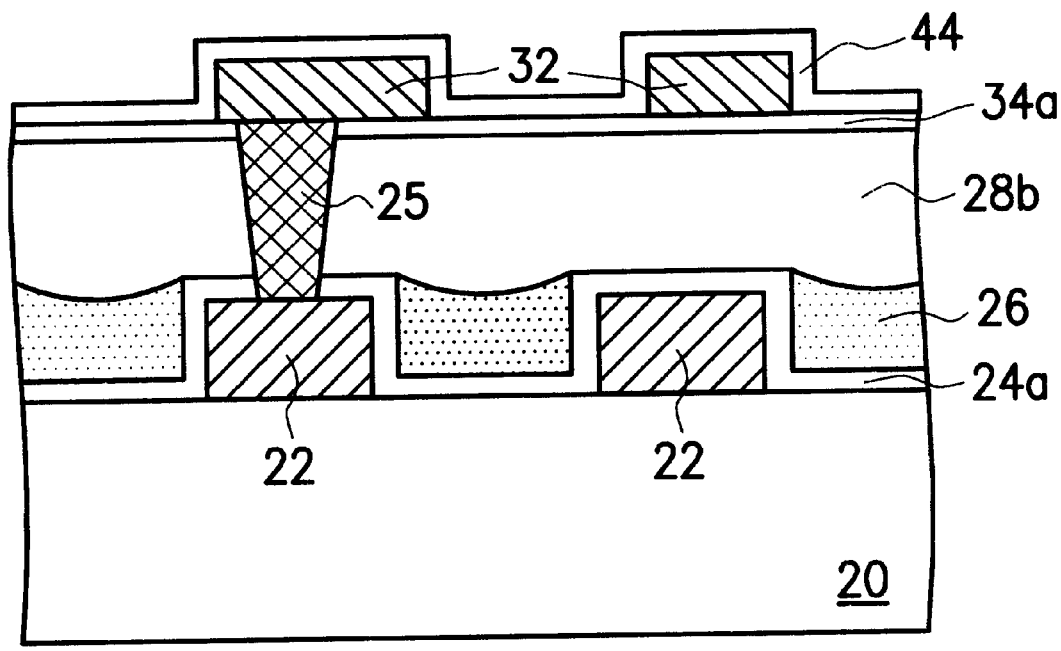

Next, as shown in FIG. 2D, a metal plug 25 is formed to act as an electrical connection between the metallic layer 22 and another sub subsequently formed metallic layer. After the above operations, the original silicon-rich oxide layer 34, the oxide layer 28a and the silicon-rich oxide layer 24 now become a silicon-rich oxide layer 34a, an oxide layer 28b and a silicon-rich oxide layer 24a. Thereafter, a metallic layer 32 is formed over the silicon-rich oxide layer 34a, and then the metallic layer 32 is patterned. The metallic layer 32 can be made, for example, from aluminum or aluminum alloy. Subsequently, a conformal silicon-rich oxide layer 44 is formed over the metallic layer 32 and the silicon-rich oxide layer 34a, in a manner similar to the step shown in FIG. 2A. Hence, the metallic layer 32 is fully enclosed by the silicon-rich oxide layer 34a and 44, and direct contact between the metallic layer 32 and the silicon dioxide layer within the inter-metal dielectric layer is avoided. Consequently, lattice vacancies/voids that can lead to conventional stress migration and thermal induced migration problems are prevented.

Finally, steps as shown in FIGS. 2B through 2D can be repeated depending on interconnect requirements.

In summary, the characteristics of this invention include:

(1) By forming a silicon-rich oxide layer both before and after the formation of a metallic layer, the metallic layer is fully enclosed by silicon-rich oxide layers. Any direct contact between the metallic layer and any silicon dioxide layer is avoided. Since the quantity of silicon in the silicon-rich oxide layer is much higher than in a silicon dioxide layer, bonds formed between a silicon atom and an oxygen atom in the silicon-rich oxide layer are much stronger. Consequently, the chance for an aluminum atom in the metallic layer to react with an oxygen atom in the silicon-rich oxide layer is greatly reduced.

(2) The silicon-rich oxide enclosed metallic layer effectively prevents the generation of lattice vacancies and voids.

(3) This invention is capable of preventing stress migration and thermally induced migration problems.

(4) The invention is capable of lowering the possibility of metal line failure, thereby increasing device reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing metallic interconnects comprising the steps of:

providing a semiconductor substrate;

forming a first silicon-rich oxide layer over the semiconductor substrate;

forming a first metallic layer on the first silicon-rich oxide layer;

forming a second silicon-rich oxide layer conformal to and directly on the first metallic layer, wherein the first metallic layer is isolated and protected by the first and second silicon-rich oxide layers;

forming a glass layer on the second silicon-rich oxide layer, wherein the glass layer fills up gaps of the second silicon-rich oxide layer;

forming a dielectric layer over the second silicon-rich oxide layer and on the glass layer;

forming a third silicon-rich oxide layer on the dielectric layer; and forming a plug penetrating through the second silicon-rich oxide layer, the dielectric layer and the third silicon-rich oxide layer to couple to the first metallic layer.

2. The method of claim 1, wherein the dielectric layer includes an inter-metal dielectric layer made of silicon dioxide.

3. The method of claim 1, wherein after the step of forming a plug, a second metallic layer is formed subsequently on the third silicon-rich oxide layer.

4. The method of claim 1, wherein the step of forming the first metallic layer includes depositing aluminum.

5. The method of claim 1, wherein the step of forming the first metallic layer includes depositing aluminum alloy.

6. A method of manufacturing metallic interconnects comprising the steps of:
   a. providing a semiconductor substrate that has at least a first metallic layer already formed thereon;
   b. forming a conformal first silicon-rich oxide layer on the metallic layer and the substrate;
   c. forming a glass layer between and directly on gaps of the first silicon-rich oxide layer;
   d. forming a dielectric layer over the first silicon-rich oxide layer and the glass layer;
   e. forming a second silicon-rich oxide layer over the dielectric layer;
   f. forming a metal plug through the second silicon-rich oxide layer, the dielectric layer and the first silicon-rich oxide layer for connecting to the first metallic layer;
   g. forming a second metallic layer over the second silicon-rich oxide layer; and
   h. forming a conformal, third silicon-rich oxide layer over the second metallic layer and the second silicon-rich oxide layer.

7. The method of claim 6, wherein underneath the first metallic layer is further included an insulating layer for isolating the first metallic layer from the device in the semiconductor substrate.

8. The method of claim 6, wherein the second silicon-rich oxide layer, the dielectric layer and the first silicon-rich oxide layer together constitute an inter-metal dielectric layer.

9. The method of claim 6, wherein the step of forming the first metallic layer includes depositing aluminum.

10. The method of claim 6, wherein the step of forming the first metallic layer includes depositing aluminum alloy.

11. The method of claim 6, wherein the step of forming the second metallic layer includes depositing aluminum.

12. The method of claim 6, wherein the step of forming the second metallic layer includes depositing aluminum alloy.

13. The method of claim 6, wherein after step h a repetition of steps c to h is further included.

* * * * *